(12) United States Patent
Lee et al.

(10) Patent No.: US 7,589,026 B2
(45) Date of Patent: Sep. 15, 2009

(54) METHOD FOR FABRICATING A FINE PATTERN IN A SEMICONDUCTOR DEVICE

(75) Inventors: Sung-Kwon Lee, Ichon-shi (KR); Jae-Young Lee, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 131 days.

(21) Appl. No.: 11/743,669

(22) Filed: May 3, 2007

(65) Prior Publication Data
US 2008/0003834 A1 Jan. 3, 2008

(30) Foreign Application Priority Data
Jun. 30, 2006 (KR) .................. 10-2006-0061421

(51) Int. Cl.
*H01L 21/302* (2006.01)
*H01L 21/461* (2006.01)

(52) U.S. Cl. .................. 438/714; 438/736; 438/781; 216/47; 257/E21.024; 257/E21.033

(58) Field of Classification Search .......... 438/714, 438/782, 715, 717, 736, 781, 945, 947, 950, 438/952; 257/E21.024, E21.026, E21.029, 257/E21.033, E21.035, E21.037
See application file for complete search history.

(56) References Cited

U.S. PATENT DOCUMENTS

| | | | |
|---|---|---|---|
| 5,423,945 A | 6/1995 | Marks et al. | |
| 5,920,796 A | 7/1999 | Wang et al. | |
| 6,573,030 B1 | 6/2003 | Fairbairn et al. | |
| 6,951,810 B2 | 10/2005 | Abell | |
| 2003/0073028 A1* | 4/2003 | Kim et al. | 430/270.1 |
| 2003/0164354 A1* | 9/2003 | Hsieh et al. | 216/22 |
| 2004/0018742 A1 | 1/2004 | He et al. | |
| 2004/0063327 A1* | 4/2004 | Chae et al. | 438/706 |
| 2007/0119545 A1* | 5/2007 | Del Puppo et al. | 156/345.26 |

FOREIGN PATENT DOCUMENTS

KR 10-2005-0058916 A 6/2005
KR 10-2006-0019668 A 3/2006

OTHER PUBLICATIONS

Makoto Nakajima et al.; "Design and Development of Next Generation Bottom Anti-Reflective Coatings for 45 nm Process with Hyper NA Lithography"; Advances in Resist Technology and Processing XXIII; Proc. Of SPIE vol. 6152, 61532L, (2006); USA.
Willie Perez et al., "Hybrid BARC Approaches for FEOL and BEOL Integration"; Advances in Resist Technology and Processing XXII; Proc. Of Spie: vol. 5753; USA.

* cited by examiner

*Primary Examiner*—Caridad M Everhart
(74) *Attorney, Agent, or Firm*—Townsend and Townsend and Crew LLP

(57) ABSTRACT

A method for fabricating a fine pattern in a semiconductor device includes forming a first polymer layer and a second polymer layer over an etch target layer. The second polymer layer is patterned at a first substrate temperature. The first polymer layer is etched at a second substrate temperature using an etch gas that does not include oxygen ($O_2$). The first polymer layer is etched using the patterned second polymer layer as an etch mask. The etch target layer is then etched using the etched first polymer layer and the etched second polymer layer as an etch mask.

20 Claims, 4 Drawing Sheets

ETCH GAS INCLUDING CF$_4$

METHOD FOR FABRICATING A FINE PATTERN IN A SEMICONDUCTOR DEVICE

CROSS-REFERENCE TO RELATED APPLICATIONS

The present invention claims priority to Korean patent application number 10-2006-0061421, filed on Jun. 30, 2006, which is incorporated by reference in its entirety.

BACKGROUND OF THE INVENTION

The present invention relates to a method for fabricating a semiconductor device, and more particularly, to a method for forming a fine pattern in a semiconductor device.

Amorphous carbon has been used as part of a hard mask stack structure for use in patterning an N-channel metal-oxide semiconductor field effect transistor (NMOSFET) device when forming a fine pattern of 100 nm or less. Such a technology allows easier patterning, and exhibits better selectivity than typical capping or protective materials of a silicon oxide ($SiO_2$) layer, silicon nitride ($Si_3N_4$) layer, and a silicon oxynitride (SiON) layer.

However, using amorphous carbon as a hard mask increases fabrication costs up to ten times when compared to using a polysilicon layer as the hard mask. Furthermore, amorphous carbon exhibits deteriorated step coverage when formed over a peripheral region with large height differences, i.e., over various key boxes (e.g. align keys) used for monitoring photo and etch processes. Thus, a subsequent SiON layer may be formed unevenly. Consequently, when performing a rework process on photoresist during a photo-exposure process, portions of the amorphous carbon may be lost. Furthermore, undesired consequences, such as lifting and particle generation, may occur on the device where the portions of the amorphous carbon are lost.

SUMMARY OF THE INVENTION

Embodiments of the present invention provide a method for forming a fine pattern in a semiconductor device. Different types of polymer hard masks can be applied to embody a fine pattern of 60 nm or less by reducing deformation of a hard mask pattern when etching to form the different types of hard masks.

In accordance with an aspect of the present invention, a method for forming a fine pattern in a semiconductor device is provided. A first polymer layer is formed over an etch target layer, and a second polymer layer is formed over the first polymer layer. The second polymer layer is patterned at a first substrate temperature. The first polymer layer is etched at a second substrate temperature using an etch gas that does not include oxygen ($O_2$). The first polymer layer is etched using the patterned second polymer layer as an etch mask. The etch target layer is then etched using the etched first polymer layer and the etched second polymer layer as an etch mask.

In accordance with another aspect of the present invention, a method for forming a fine pattern in a semiconductor device is provided. An etch target layer is formed over a substrate. A first polymer layer is formed over the etch target layer, and the first polymer layer includes a carbon-rich polymer layer. A second polymer layer is formed over the first polymer layer. A photoresist pattern is formed over portions of the second polymer layer. The second polymer layer is etched at a first substrate temperature using the photoresist pattern as an etch mask. The first polymer layer is etched at a second substrate temperature using a first etch gas that does not include oxygen ($O_2$). The etch target layer is etched using the etched first polymer layer and the etched second polymer layer as an etch mask.

DESCRIPTION OF SPECIFIC EMBODIMENTS

The present invention relates to a method for fabricating a fine pattern in a semiconductor device. According to an embodiment of the present invention, a desired fine pattern may be effectively patterned by reducing pattern deformation when etching a carbon-rich polymer hard mask pattern in a highly-integrated device of 60 nm or less.

In one embodiment, different types of polymer hard masks are continuously applied using a spin on coating (SOC) method and a photoresist pattern process is performed. The polymer hard masks include an upper layer of a silicon-rich second polymer layer and a bottom layer of a carbon-rich first polymer layer. During a subsequent etching process using plasmas, the carbon-rich first polymer layer is etched using the upper layer of the silicon-rich second polymer layer as a hard mask. The carbon-rich first polymer layer is used as a bottom hard mask.

Devices having highly integrated, controlling polymers on sidewalls are problematic when etching the second polymer layer. Limitations directed to bowing events may be generated. Also, the second polymer layer may be damaged by an etch gas when etching the first polymer layer, thereby generating patterns having undesirable formations.

Figure 1A:
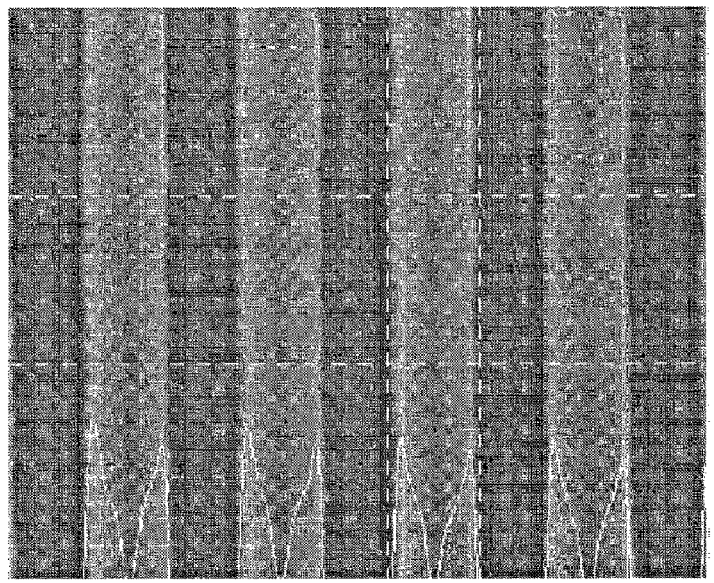
FIGS. 1A and 1B illustrate a micrographic view showing limitations of pattern deformation.
Figure 1B:

FIGS. 1A and 1B illustrate a micrographic view showing limitations of pattern deformation. FIG. 1A illustrates a micrographic view showing a pattern having an approximately 80 nm pattern size, and FIG. 1B illustrates a micrographic view showing a pattern having an approximately 60 nm pattern size. Substantially the same conditions are applied in the processes for etching a first polymer layer using a second polymer layer as a hard mask in both FIGS. 1A and 1B. As the pattern size decreases, the first polymer hard mask may show substantial pattern deformation, as represented by reference denotation 'A'. The present invention introduces an etch treatment for reducing pattern deformation when forming a fine pattern of approximately 60 nm using different types of polymer hard masks.

FIGS. 2A to 2D illustrate cross-sectional views of a method for forming a fine pattern in a semiconductor device according to an embodiment of the present invention.

Figure 2A:
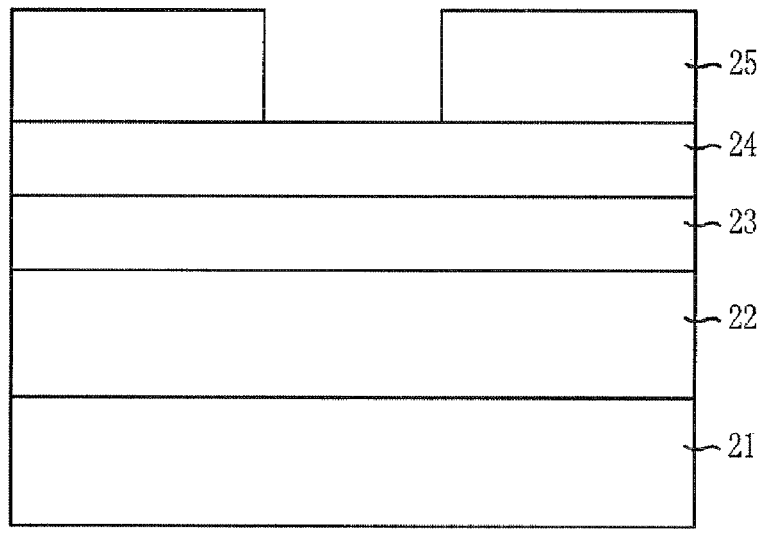
FIGS. 2A to 2D illustrate cross-sectional views of a method for forming a fine pattern in a semiconductor device according to an embodiment of the present invention.

Referring to FIG. 2A, an etch target layer 22 is formed over a substrate 21. The etch target layer 22 may include a semiconductive layer such as a conductive layer, an insulation layer, or a silicon layer. A carbon-rich first polymer layer 23 and a silicon-rich second polymer layer 24 are sequentially formed over the etch target layer 22 using a SOC method. The second polymer layer 24 may be formed as siloxane or silsesqioxane (SSQ), and may have a silicon content ranging from approximately 20% to approximately 45%. A photoresist pattern 25 is formed over portions of the second polymer layer 24.

Figure 2B:
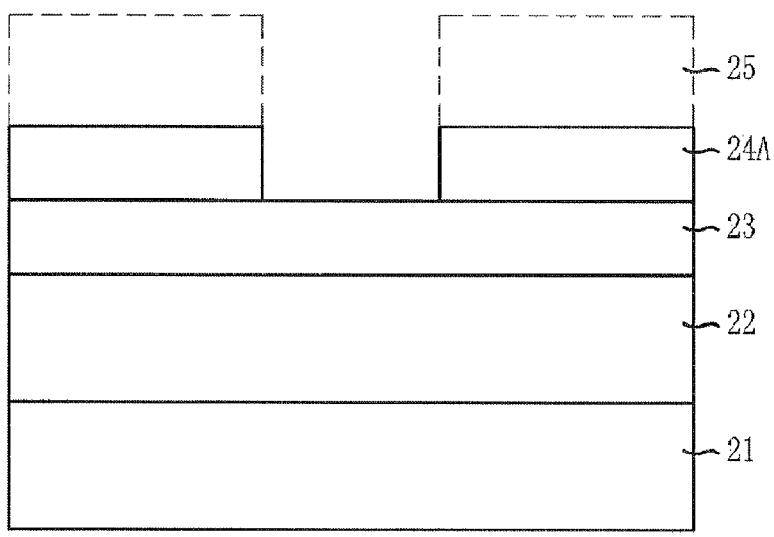

Referring to FIG. 2B, the second polymer layer 24 is etched using the photoresist pattern 25 as an etch mask to form a second polymer hard mask 24A. The second polymer layer 24 is etched using a fluorine-based gas, e.g., an etch gas including tetrafluoromethane ($CF_4$) gas. For instance, the second polymer layer 24 may be etched using an etch gas such as $CF_4$, $CF_4$/fluoroform ($CHF_3$), and $CF_4$/oxygen ($O_2$).

The fluorine-based gas is used as a main etch gas when etching the second polymer layer 24. $CHF_3$ and $O_2$ may function to control critical dimensions. A substrate temperature ranging from approximately −10° C. to approximately 30° C. is maintained when etching the second polymer layer 24. Performing the etching at the aforementioned temperature may decrease the pattern deformation. All or portions of the photoresist pattern 25 may be removed after the second polymer layer 24 is etched. Hereinafter, the etched second polymer layer 24 is referred to as a second polymer hard mask 24A.

Figure 2C:
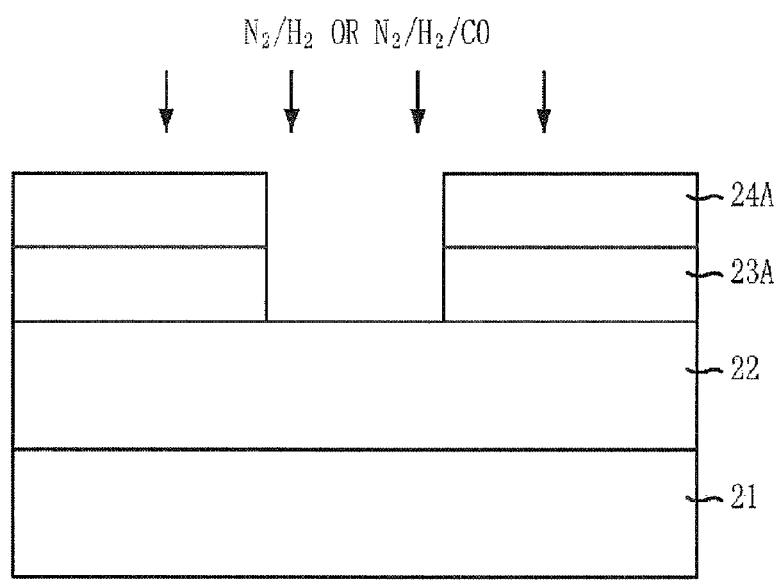

Referring to FIG. 2C, the first polymer layer 23 is etched using the second polymer hard mask 24A as an etch mask. The first polymer layer 23 is etched using an etch gas such as nitrogen ($N_2$)/hydrogen ($H_2$) or $N_2/H_2$/carbon monoxide (CO).

Typically, $N_2/O_2$ or $N_2/H_2$ gas is used when etching a first polymer layer. When etching using only the $N_2/O_2$ gas, controlling polymers on sidewalls of the second polymer hard mask 24A may be difficult. Thus, limitations related to bowing events may be generated. When etching using only the $N_2/H_2$ gas, an etch speed of the first polymer layer 23 may be slow. When etching the first polymer layer 23, the etch gas used when etching the first polymer layer 23 may also etch the second polymer hard mask 24A, thereby generating pattern deformation when patterning bottom layers.

In this embodiment, the first polymer layer 23 may be etched using the $N_2/H_2$ or $N_2/H_2/CO$ gas, excluding $O_2$, to reduce pattern deformation when etching the first polymer layer 23. Using the aforementioned etch gases to etch the first polymer layer 23 may maintain a desired line width without pattern deformation.

A ratio of $N_2$ to $H_2$ may be approximately 1:2.5 in the $N_2/H_2$ or $N_2/H_2/CO$ gas. Such a ratio may reduce the pattern deformation and control critical dimensions.

A substrate temperature ranging from approximately −10° C. to approximately 30° C. is maintained when etching the first polymer layer 23. Performing the etching at the aforementioned temperature may decrease the pattern deformation. Hereinafter, the etched first polymer layer 23 is referred to as a first polymer hard mask 23A.

Figure 2D:
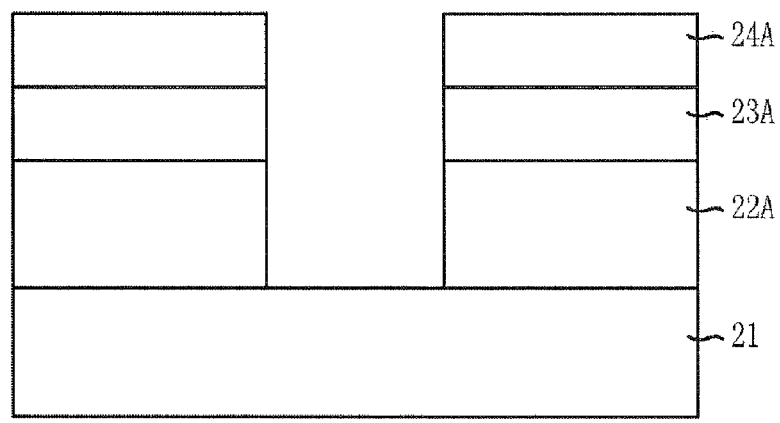

Referring to FIG. 2D, the etch target layer 22 is etched using the second polymer hard mask 24A and the first polymer hard mask 23A as an etch mask to form an etch target pattern 22A.

Figure 3:
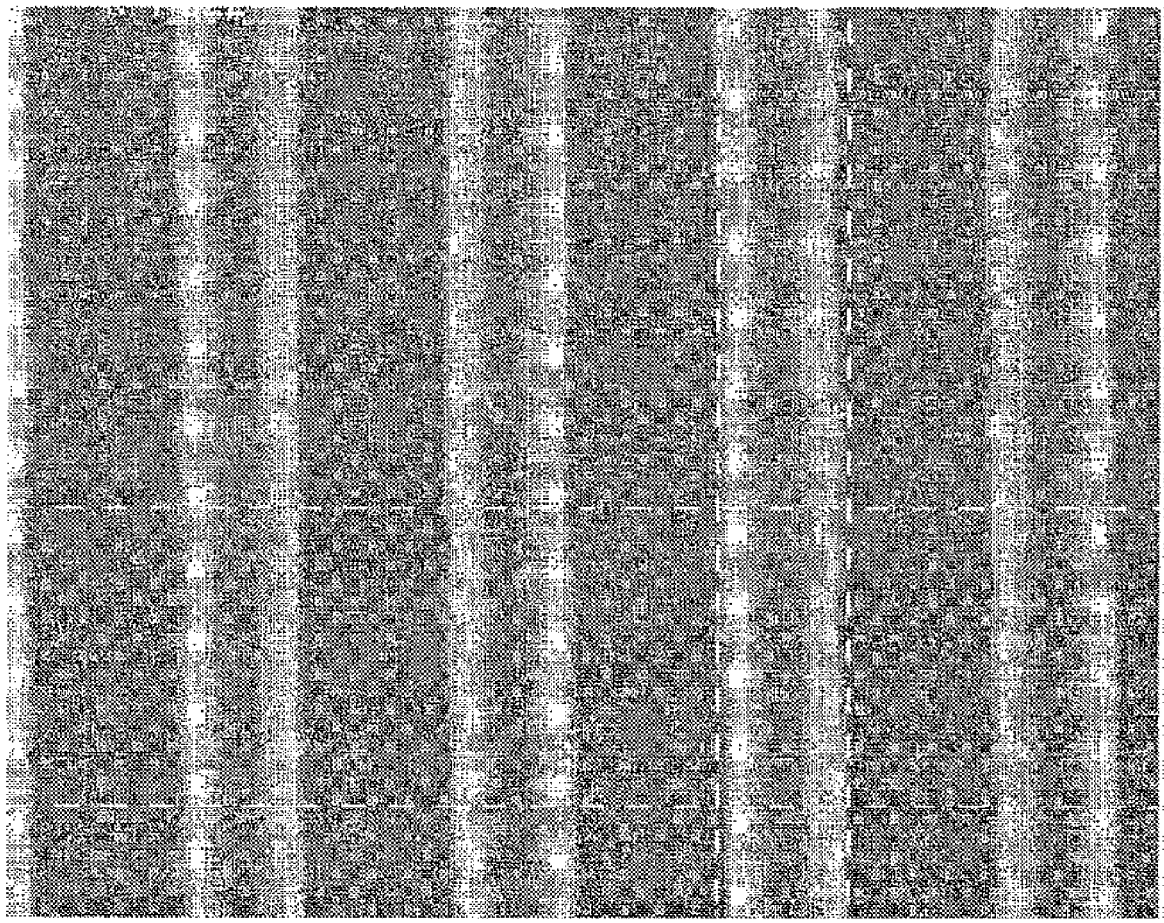
FIG. 3 illustrates a micrographic view showing a resulting pattern after the embodiment of the present invention is applied.

FIG. 3 illustrates a micrographic view showing a result after the embodiment of the present invention is applied. A fine pattern is embodied without pattern deformation while etching a first polymer layer using a second polymer hard mask.

According to the embodiment of the present invention, using the carbon-rich first polymer layer and the silicon-rich second polymer layer as hard masks for etching the etch target layer may improve the step coverage characteristic over regions with large height differences.

The $N_2/H_2$ or $N_2/H_2/CO$ gas (excluding $O_2$) may be used as the main etch gas when etching the first polymer layer using the second polymer hard mask as an etch mask. Using such gases may reduce etch losses of the second polymer hard mask while etching the first polymer layer. Thus, the pattern deformation of the second polymer hard mask and the first polymer hard mask may be reduced, and the pattern with a fine line width of approximately 60 nm may be formed.

While the present invention has been described with respect to specific embodiments, it will be apparent to those skilled in the art that various changes and modifications may be made without departing from the spirit and scope of the invention as defined in the following claims.

What is claimed is:

1. A method for forming a fine pattern in a semiconductor device, the method comprising:
   forming a first polymer layer over an etch target layer;
   forming a second polymer layer over the first polymer layer, wherein the second polymer layer comprises a silicon-rich polymer layer;
   patterning the second polymer layer at a first substrate temperature;
   etching the first polymer layer at a second substrate temperature, wherein the first polymer layer is etched using a first etch gas that does not include oxygen ($O_2$), the first polymer layer being etched using the patterned second polymer layer as an etch mask; and
   etching the etch target layer using the etched first polymer layer and the patterned second polymer layer as an etch mask.

2. The method of claim 1, wherein the first and second substrate temperatures each range from approximately −10° C. to approximately 30° C.

3. The method of claim 1, wherein the first polymer layer and the second polymer layer are formed using a spin-on coating (SOC) method.

4. The method of claim 1, wherein the second polymer layer includes siloxane or silsesqioxane (SSQ).

5. The method of claim 1, wherein the second polymer layer has a silicon content ranging from approximately 20% to approximately 45%.

6. The method of claim 1, wherein the first polymer layer comprises a carbon-rich polymer layer.

7. The method of claim 1, wherein the second polymer layer is patterned using a second etch gas including a fluorine-based gas.

8. The method of claim 7, wherein the second etch gas comprises tetrafluoromethane ($CF_4$), $CF_4$/fluoroform ($CHF_3$), $CF_4/O_2$, or a combination thereof.

9. The method of claim 1, wherein the first etch gas comprises nitrogen ($N_2$)/hydrogen ($H_2$) etch gas, $N_2/H_2$/carbon monoxide (CO) etch gas, or both.

10. The method of claim 9, wherein a ratio of $N_2$ to $H_2$ is approximately 1:2.5 in the $N_2/H_2$ etch gas or the $N_2/H_2/CO$ etch gas.

11. A method for forming a fine pattern in a semiconductor device, the method comprising:
   forming an etch target layer over a substrate;
   forming a first polymer layer over the etch target layer, the first polymer layer including a carbon-rich polymer layer;
   forming a second polymer layer over the first polymer layer;
   forming a photoresist pattern over portions of the second polymer layer;
   etching the second polymer layer at a first substrate temperature using the photoresist pattern as an etch mask;
   etching the first polymer layer at a second substrate temperature using a first etch gas that does not include oxygen ($O_2$); and etching the etch target layer using the etched first polymer layer and the etched second polymer layer as an etch mask.

12. The method of claim 11, wherein the first and second substrate temperatures each range from approximately −10° C. to approximately 30° C.

13. The method of claim 11, wherein the first polymer layer is etched using the etched second polymer layer as an etch mask.

14. The method of claim 11, wherein the second polymer layer is etched using a second etch gas including a fluorine-based gas.

15. The method of claim 14, wherein the second etch gas comprises tetrafluoromethane ($CF_4$), $CF_4$/fluoroform ($CHF_3$), $CF_4/O_2$, or a combination thereof.

16. The method of claim 11, wherein the first etch gas comprises nitrogen ($N_2$)/hydrogen ($H_2$) etch gas, $N_2/H_2$/carbon monoxide (CO) etch gas, or both.

17. The method of claim 16, wherein a ratio of $N_2$ to $H_2$ is approximately 1:2.5 in the $N_2/H_2$ etch gas or the $N_2/H_2$/CO etch gas.

18. The method of claim 11, wherein the second polymer layer comprises a silicon-rich polymer layer.

19. The method of claim 18, wherein the second polymer layer includes siloxane or silsesqioxane (SSQ).

20. The method of claim 18, wherein the second polymer layer has a silicon content ranging from approximately 20% to approximately 45%.

* * * * *